US008126696B1

(12) United States Patent
Faraboschi et al.

(10) Patent No.: US 8,126,696 B1
(45) Date of Patent: Feb. 28, 2012

(54) MODIFYING LENGTH OF SYNCHRONIZATION QUANTA OF SIMULATION TIME IN WHICH EXECUTION OF NODES IS SIMULATED (75) Inventors: Paolo Faraboschi, Barcelona (ES); Daniel Ortega, Barcelona (ES); Ayose Falcon Samper, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 677 days.

(21) Appl. No.: 12/252,121

(22) Filed: Oct. 15, 2008

(51) Int. Cl.
*G06F 13/10* (2006.01)
(52) U.S. Cl. ............... 703/21; 703/14; 703/17; 703/22
(58) Field of Classification Search ............ 703/14, 703/17, 22, 21; 709/248; 714/33
See application file for complete search history.

(56) References Cited

U.S. PATENT DOCUMENTS

| 6,507,809 | B1 * | 1/2003 | Yoshino et al. ............... 703/21 |
| 2003/0093569 | A1 * | 5/2003 | Sivier et al. ............... 709/248 |
| 2004/0024578 | A1 * | 2/2004 | Szymanski et al. ............ 703/17 |
| 2006/0036426 | A1 * | 2/2006 | Barr et al. ...................... 703/22 |
| 2006/0195821 | A1 * | 8/2006 | Vanspauwen et al. ......... 717/124 |
| 2007/0226542 | A1 * | 9/2007 | Beeston et al. ............... 714/33 |
| 2009/0187395 | A1 * | 7/2009 | Manohar et al. .............. 703/17 |

OTHER PUBLICATIONS

Fujimoto, R.M., "Exploiting temporal uncertainty in parallel and distributed simulation", IEEE 1999.*
Loper et al., "Pre-sampling as an approah to exploiting temporal uncertainty", IEEE 2000.*
Maeda et al., "Hybrid testbed enabling runtime operations for wireless applications", IEEE 2008.*
Graham et al., "Evaluation of a prototype visualization for distributed simulations", IEEE 1998.*
Vaidya, N.H., "Staggered consistent checkpointing", IEEE 1999.*
Parakash et al., "Asynchronous parallel simulation of parallel programs", IEEE 2000.*
Lagedza et al., "Reducing synchronization overhead in parallel simulation", IEEE 1996.*
Falcon et al., "An adaptive synchronization technique for parallel simulation of networked clusters", IEEE 2008.*
Parakash et al., "MPI-SIM: using parallel simulation to evaluate MPI programs", IEEE 1998.*
ONicol, D.M., "Stability, locality, partitioning and synchronization in PDES", IEEE 1998.*
S.K. Reinhardt et al., "The Wisconsin wind tunnel: virtual protyping of parallel computers," Procs. of 1993 ACM SIGMETRICS Conf., 1993.
D.C. Burger et al., "Accuracy vs. performance in parallel simulation of interconnection networks," Int'l Symp. on Parallel Processing, 1995.
H. Davis et al., "Tango: A multiprocessor simulation and tracing system," Technical Report CSL-TR-90-439, 1990.

(Continued)

*Primary Examiner* — Kandasamy Thangavelu (57) ABSTRACT

Nodes interconnected by a network have their substantially parallel execution simulated. Substantially parallel execution of the nodes during a current quantum of simulation time having a quantum length is simulated. Simulation of execution can result in simulation of inter-node data packets being transmitted over the network. When the current quantum of simulation time has elapsed, simulation of execution of the nodes is synchronized. If no inter-node data packets were transmitted in simulation during the current quantum of simulation time, then the quantum length is increased. If one or more inter-node data packets were transmitted in simulation during the current quantum of simulation time, then the quantum length is decreased. This process is then repeated for a next quantum of simulation time having the quantum length as has been increased or decreased.

15 Claims, 8 Drawing Sheets

OTHER PUBLICATIONS

J. Misra, "Distributed discrete-event simulation," Computing Surveys, 1986.

R.M. Fujimoto, "Parallel discrete event simulation" ACM Communications, 1990.

G. Lencse, "Efficient parallel simulation with the statistical synchronization method," 1998 Western Multiconf. on Simulation/Comm. Networks & Distributed Sys., 1998.

P.S. Magnusson et al., "Simics: A full system simulation platform," Computer magazine, 2002.

J. Engblom et al., "Simics: A commercially proven full-system simulation framework," Workshop on Simulation in European Space Programmes, 2006.

M. Bergqvist et al., "Some experience from the development of a simulator for a telecom cluster," Software Eng'g & Applns., 2006.

\* cited by examiner

MODIFYING LENGTH OF SYNCHRONIZATION QUANTA OF SIMULATION TIME IN WHICH EXECUTION OF NODES IS SIMULATED

CROSS REFERENCE TO RELATED APPLICATIONS

This application claims the benefit of U.S. Provisional Application Ser. No. 61/091,397, filed Aug. 24, 2008, titled "Modifying Length Of Synchronization Quanta Of Simulation Time In Which Execution Of Nodes Is Simulated"

BACKGROUND

Some types of computing systems have a number of nodes. A node may include one or more processors, and may also include its own memory and/or storage devices. For example, a multiple-node computing system may include a number of discrete computing devices, such as server computing devices, which correspond to the nodes of the computing system. As another example, a multiple-node computing system may include a number of processors within a single integrated circuit (IC) chip, which is commonly referred to as chip multiprocessors (CMP's). The processors on such an IC chip may be divided over a number of nodes of the multiple-node computing system, where each node includes one or more of the processors on the IC chip.

Simulating the execution of a multiple-node computing system can be difficult. While the nodes of such a computing system may execute in parallel with one another, at times the nodes may send inter-node data packets to each other that require simulation of their execution to be synchronized. If the timing of the inter-node data packets is ignored—i.e., when the inter-node data packets are received by their destination nodes—then simulation can occur more quickly, but simulation accuracy suffers. By comparison, if the timing of the inter-node data packets is always accounted for, then simulation accuracy can be guaranteed, but simulation completion time suffers.

SUMMARY

A method according to an embodiment of the present disclosure is for simulating execution of nodes interconnected by a network. The method simulates substantially parallel execution of the nodes during a current quantum of simulation time having a quantum length. Simulation of execution can result in simulation of inter-node data packets being transmitted over the network. Where the current quantum of simulation time has elapsed, the method synchronizes simulation of execution of the nodes. If no inter-node data packets were transmitted in simulation during the current quantum of simulation time, then the method increases the quantum length. If one or more inter-node data packets were transmitted in simulation during the current quantum of simulation time, then the method decreases the quantum length. The method is repeated until simulation of execution of the nodes has finished.

A system according to an embodiment of the present disclosure is for simulating substantially parallel execution of nodes interconnected by a network. The system includes hardware and one or more simulation components implemented within the hardware. The simulation components simulate substantially parallel execution of the nodes over a number of quanta of simulation time having a quantum length. Simulation of execution within each quantum can result in simulation of inter-node data packets being transmitted over the network. Simulation of execution of the nodes is further synchronized in-between successive quanta.

The simulation components also dynamically modify the quantum length in-between successive quanta, such that a likelihood that a straggler inter-node data packet results during simulation is reduced while permitting simulation to be quickly completed. A straggler inter-node data packet is an inter-node data packet transmitted in simulation from a first node to a second node and that arrives at the second node later than when the straggler inter-node data packet was scheduled to arrive at the second node.

A computer-readable medium according to an embodiment of the present disclosure has one or more computer programs stored thereon that are executable by one or more processors to perform a method. The method is for dynamically modifying a quantum length of a number of quanta of simulation time in which substantially parallel execution of nodes interconnected by a network are simulated. Simulation of execution within each quantum can result in simulation of inter-node data packets being transmitted over the network. Simulation of execution of the nodes is synchronized in-between successive quanta.

After each quantum of simulation time, the method performs the following. Where no inter-node data packets were transmitted in simulation during the quantum of simulation time, the method increases the quantum length of a next quantum of simulation time such that the quantum length slowly increases over successive increases. Where one or more inter-node data packets were transmitted in simulation during the quantum of simulation time, the method decreases the quantum length of the next quantum of simulation time such that the quantum length quickly decreases over successive decreases.

DETAILED DESCRIPTION OF THE DRAWINGS

Figure 1A:
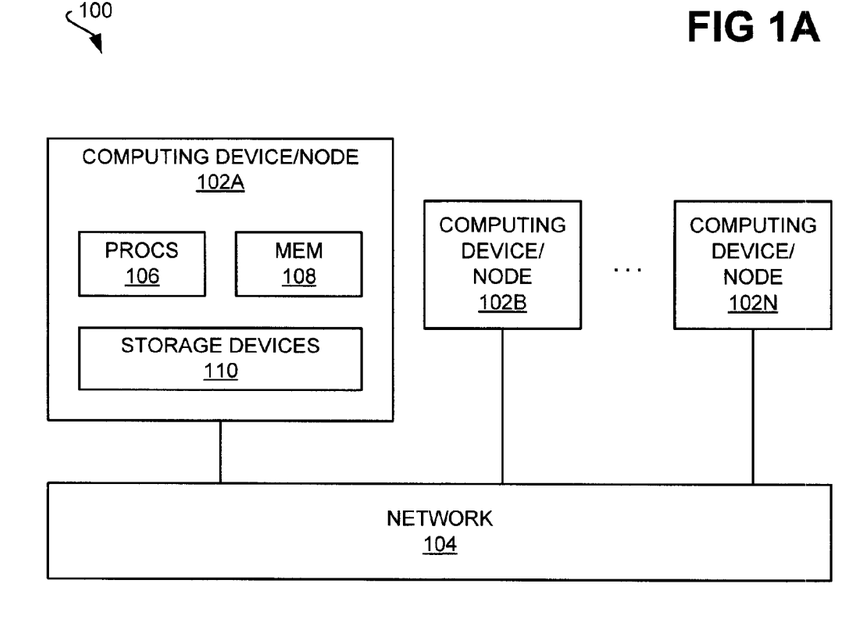
FIGS. 1A and 1B are diagrams of different multiple-node computing systems that can have their execution simulated, according to varying embodiments of the present disclosure.

FIG. 1A shows a multiple-processor computing system 100 that can have its execution simulated, according to an embodiment of the present disclosure.

The computing system 100 includes a number of discrete computing device nodes 102A, 102B, . . . , 102N, which are collectively referred to as the computing device nodes 102. Each of the nodes 102 is a discrete computing device, such as a server computing device in one embodiment. The nodes 102 may also be referred to as clusters.

The computing device node 102A is depicted in detail in FIG. 1A as representative of all the nodes 102. The computing device node 102A includes one or more processors 106, memory 108, and/or one or more storage devices 110, such as hard disk drives and the like. The computing device node 102A may include other components, in addition to and/or in lieu of those depicted in FIG. 1, such as peripheral devices, networking devices, and so on.

The computing device nodes 102 are interconnected to one another via a network 104. The network 104 may be a wired and/or a wireless network. For instance, the network 104 may be or include the Internet, intranets, extranets, local-area networks (LAN's), wide-area networks (WAN's), as well as other types of networks.

Figure 1B:
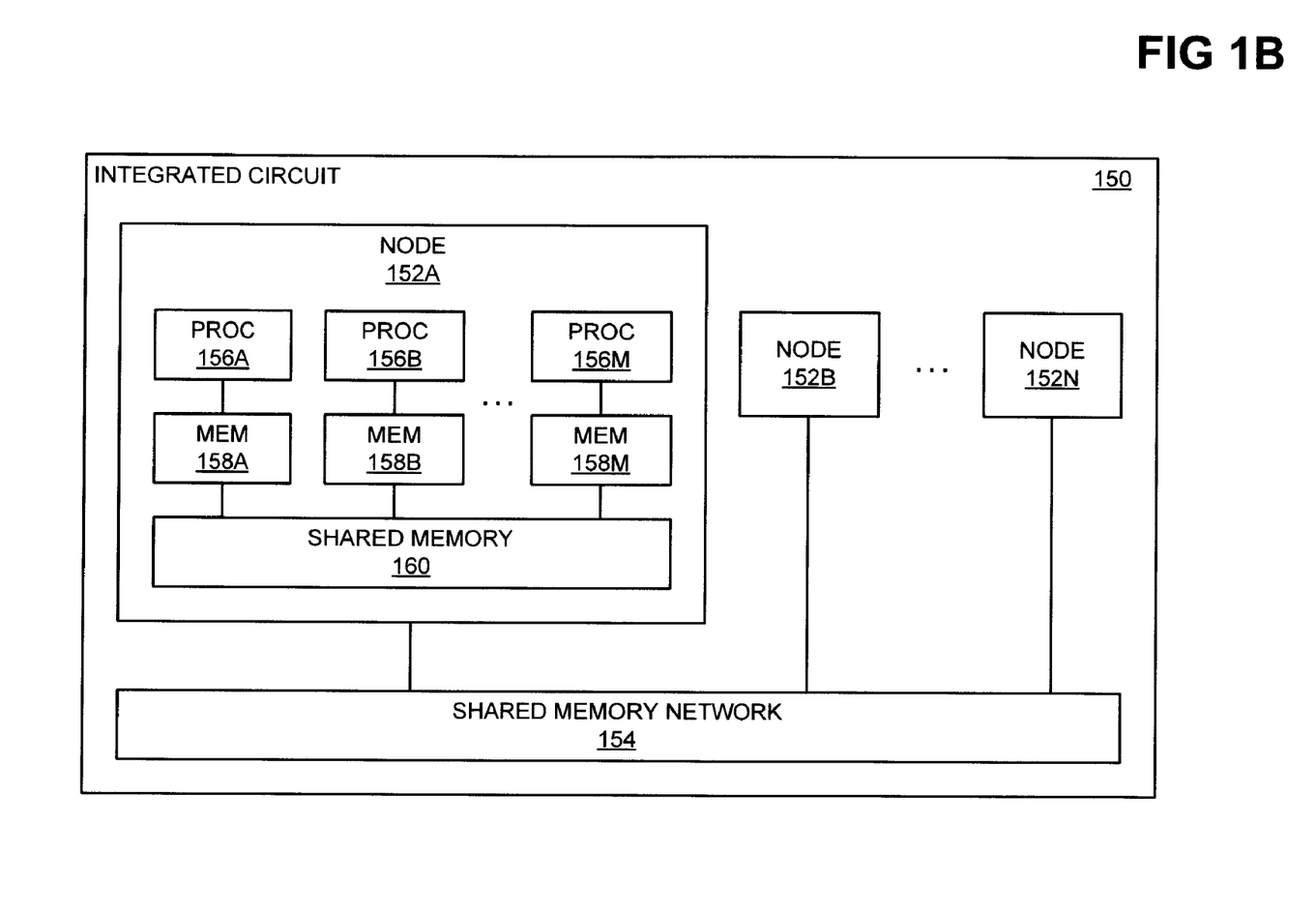

FIG. 1B shows an integrated circuit (IC) 150 that is another type of multiple-processor computing system, according to an embodiment of the present disclosure. The IC 150 can be considered a chip multiprocessor (CMP) in one embodiment. The IC 150 includes a number of nodes 152A, 152B, . . . , 152N, collectively referred to as the nodes 152, and a shared memory network 154 shared by all the nodes 152. The nodes 152 may also be referred to as clusters. The shared memory network 154 may be a level-three (L3) cache in one embodiment of the present disclosure.

The node 152A is depicted in detail in FIG. 1B as representative of all the nodes 152. The node 152A is depicted in the embodiment of FIG. 1B as including a number of processors 156A, 156B, . . . , 156M, collectively referred to as the processors 156. While there are multiple processors 156 depicted in FIG. 1B, in another embodiment, the node 152A may just have a single processor 156.

In one embodiment, the processors 156 have corresponding memories 158A, 158B, . . . , 158M, collectively referred to as the memories 158. The memories 158 are not shared among the processors 156. For example, the memory 158A is private memory for the processor 156A, and is not shared with other of the processors 156 of the node 152A, nor with other processors of other nodes. The memories 158 may be a level-one (L1) cache in one embodiment of the present disclosure.

The node 152A also includes memory 160 that is shared among all the processors 156 of the node 152A. However, the memory 160 is not shared with any other node. That is, the memory 160 is shared just by the processors 156 of the node 152A, and not with any processor of any other node. Therefore, for a collection of nodes 152, the processors 156 of each of the nodes 152 share corresponding memory 160 that is different than the corresponding memory 160 shared by the processor of each other of the nodes 152. The memory 160 may be a level-two (L2) cache in one embodiment of the present disclosure.

The nodes of the multiple-node computing systems of FIGS. 1A and 113 can execute in parallel with one another. However, at times, the execution of the nodes has to be synchronized. For example, if a data packet, such as a memory request like a read or write request, or another type of data packet, is transmitted from one node to another node over the network interconnecting the nodes, execution may have to be synchronized based on the contents of such an inter-node data packet. It can be presumed that the nodes execute in parallel without having to be synchronized more often than not. That is, for most of the execution time of a node, the node does not receive inter-node data packets from other nodes that may require synchronization. Such execution of the nodes is referred to herein as substantially parallel execution of the nodes.

Figure 2:
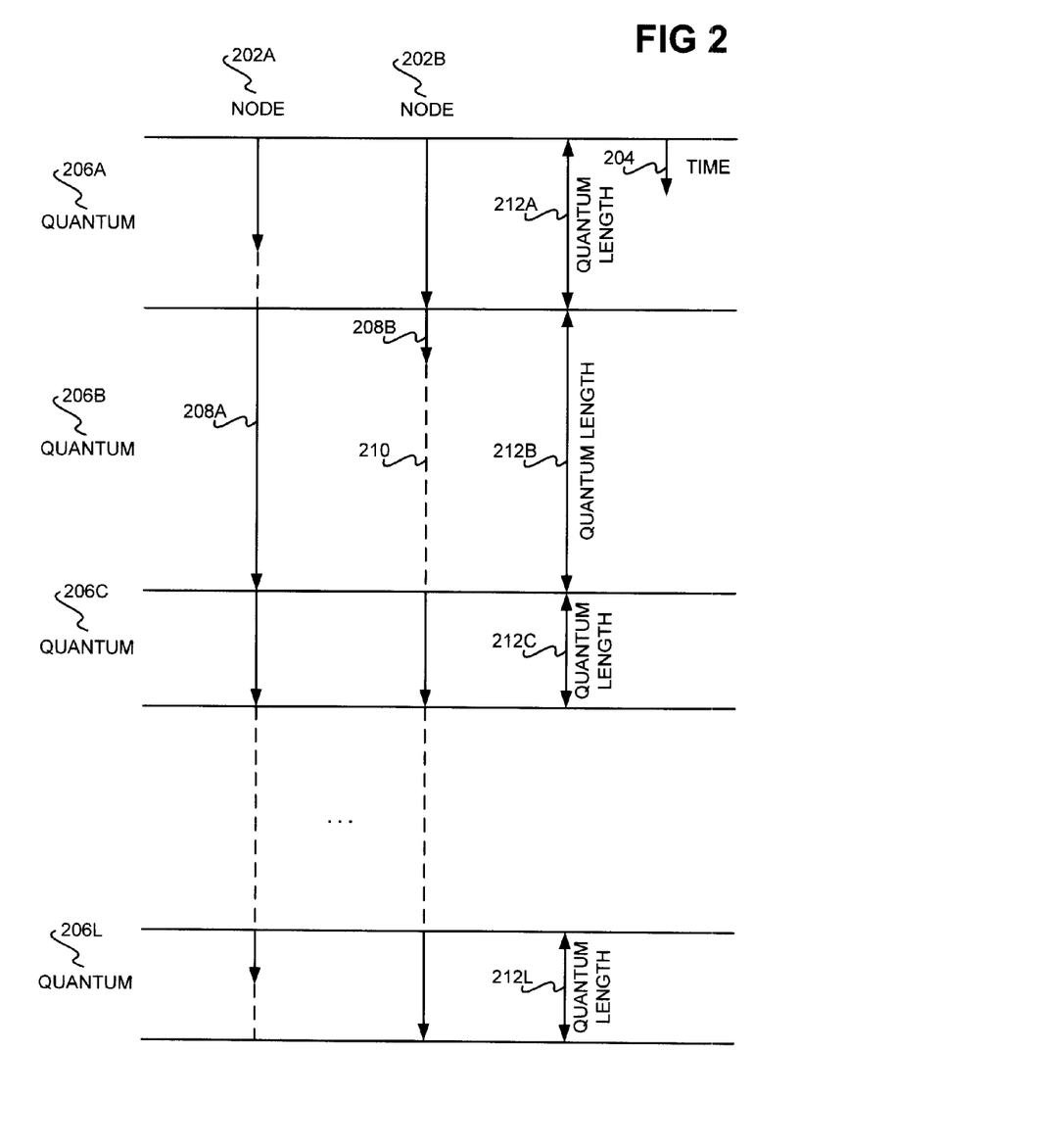
FIG. 2 is a diagram depicting how substantially parallel execution of nodes of a multiple-node computing system can be simulated using a number of quanta of simulation time, according to an embodiment of the present disclosure.

FIG. 2 shows how substantially parallel execution of the nodes of a multiple-node computing system can be simulated using quanta, according to an embodiment of the present disclosure. For convenience, two nodes 202A and 202B, collectively referred to as the nodes 202, have their substantially parallel execution being simulated. The substantially parallel execution of the nodes 202 is simulated over a number of discrete quanta of simulation time 206A, 206B, 206C, . . . , 206L, collectively referred to as the quanta 206. The execution of the nodes 202A and 202B occurs beginning at the quantum 206A and ends at the quantum 206L, such that time elapses downward in FIG. 2, as indicated by the arrow 204.

Within each quantum of simulation time 206, execution of the nodes 202 is simulated. Between successive quanta 206, simulation of execution of the nodes 202 is then synchronized. Within a given quantum 206, simulation of execution of one node 202 may be completed before the simulation of execution of the other node 202 is completed. The solid arrow under a node 202 within a given quantum 206 corresponds to the time it takes to simulate execution of the node 202 within that quantum 206. If simulation time finishes before the quantum 206 in question elapses, a dotted line denotes the length of time after simulation of execution of the node 202 has finished until the end of the quantum 206.

For example, as to the quantum of simulation time 206B, simulation of execution of the node 202A takes the entire quantum 206B, as indicated by the solid arrow 208A, whereas simulation of execution of the node 202B takes just an initial portion of the quantum 206B, as indicated by the solid arrow 208B and the dotted line 210. By comparison, in the quantum of simulation time 206A, simulation of execution of the node 202A does not take the entire quantum 206A, whereas simulation of execution of the node 202B does, as is the case in the quantum of simulation time 206L. As to the quantum of simulation time 206C, simulation of execution of both nodes 202 takes the entire quantum 206C.

The length of time of a quantum of simulation time 206 is dynamic, or variable, and is modified as is described later in the detailed description. The quanta 206 have corresponding quantum lengths of times 212A, 212B, 212C, . . . , 212L, collectively referred to as the quantum lengths of time 212. Thus, the quantum length 212A for the quantum 206A is less than the quantum length 212B for the quantum 206B, but is greater than the quantum lengths 212C and 212L for the quanta 206C and 206L.

Dividing the simulation of execution of the nodes 202 into quanta of simulation time 206 permits the substantially parallel execution of the nodes 202 to be simulated in a relatively efficient manner. Furthermore, such division into quanta 206 permits inter-node data packets that may be sent between the nodes 202 and that can require synchronization of simulation of execution of the nodes 202 to be taken into account. In particular, the quantum lengths 212 of the quanta 206 can be dynamically modified to ensure that in most cases, proper synchronization of simulation of substantially parallel execution of the nodes 202 can occur. For instance, what is attempted to be avoided is for an inter-node data packet to arrive in simulation at a given node at time $t_A$, when the node in question already has its execution being simulated at time $t_B$ greater than $t_A$. (It is noted that the phrase "in simulation" is used herein to indicate that transmission of inter-node data packets and execution of the nodes are not actually occurring in reality, but rather are being simulated.)

FIGS. 3A, 3B, 3C, and 3D show how transmission of inter-node data packets can occur in simulation when using quanta of simulation time in simulating substantially parallel execution of the nodes of a multiple-node computing system, according to different embodiments of the present disclosure. In each of these figures, time proceeds downward for the given quantum of simulation time. This is indicated by the arrow 204.

Figure 3A:
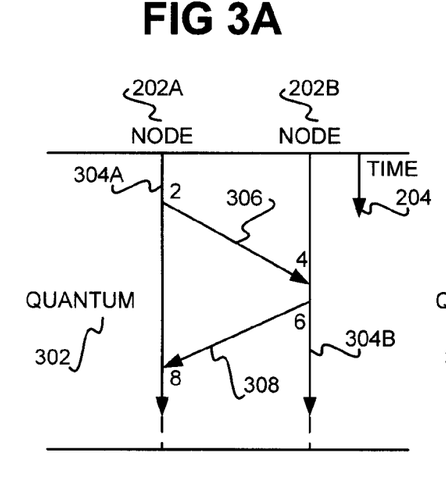
FIGS. 3A, 3B, 3C, and 3D are diagrams depicting how transmission of inter-node data packets can occur in simulation when using a number of quanta of simulation time in simulating execution of a multiple-node computing system, according to varying embodiments of the present disclosure.

In FIG. 3A, simulation of execution of the node 202A within the quantum of simulation time 302 occurs at about the same rate as simulation of execution of the node 202B within the quantum 302 does. This is indicated by the solid arrow 304A, corresponding to the execution simulation time of the node 202A within the quantum 302, being substantially equal in length to the solid arrow 304B, corresponding to the execution simulation time of the node 202B within the quantum 302. The arrows 304A and 304B can be collectively referred to as the arrows 304.

An inter-node data packet 306 is sent from the node 202A at execution simulation time point 2 and is received by the node 202B at execution simulation time point 4. The inter-node data packet 306 ideally has a latency of two, and thus FIG. 3A reflects this ideal situation occurring. It takes two units of execution time for the node 202B to process the data packet 306, and a responsive inter-node data packet 308 is sent back to the node 202A at execution simulation time point 6, which is received by the node 202A at execution simulation time point 8. The inter-node data packet 308 also ideally has a latency of two, and this is reflected in FIG. 3A.

Thus, FIG. 3A reflects the ideal situation in which the node 202A is at a current execution simulation time point of 8 when the inter-node data packet 308 is supposed to arrive at the node 202A, taking into account the expected latency time of both data packets 306 and 308 and the expected processing time of the data packet 306 at the node 202B. Stated another way, in FIG. 3A the node 202A is at a current execution simulation time point of 8 that is equal to a target execution simulation time point of 8 when the inter-node data packet 308 is supposed to arrive at the node 202A, taking into account the expected latency times of the data packets 306 and 308 and the expected processing time of the data packet 306 at the node 202B. In this ideal case, then, the inter-node data packet 308 is transmitted to the node 202A in simulation as soon as the node 202B has finished processing the data packet 306 at execution simulation time point 6, without delay and taking into account the latency of the transmission of the data packet 308.

Figure 3B:
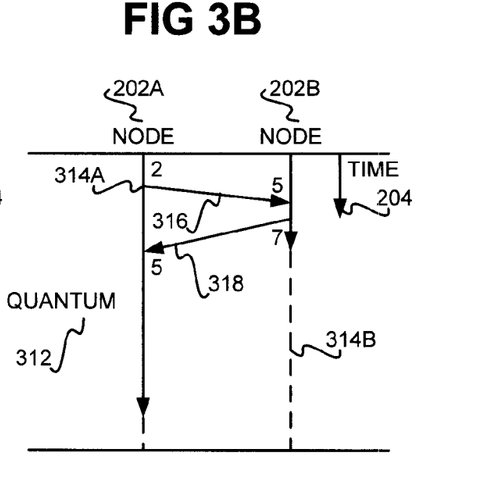

In FIG. 3B, simulation of execution of the node 202A within the quantum of simulation time 312 occurs more slowly as compared to the simulation of execution of the node 202B within the quantum 312 does. This is indicated by the solid arrow 314A, corresponding to the execution simulation time of the node 202A within the quantum 312, being longer than the solid arrow 314B, corresponding to the execution simulation time of the node 202B within the quantum 312. The arrows 314A and 314B can be collectively referred to as the arrows 314.

An inter-node data packet 316 is sent from the node 202A at execution simulation time point 2. Although the inter-node data packet 316 ideally has a latency of two, because the node 202B has its execution being simulated more quickly, the node 202B does not receive the data packet 316 until execution simulation time point 5. It takes two units of execution time for the node 202E3 to process the data packet 316, and a responsive inter-node data packet 318 is sent back to the node 202A at execution simulation time point 7. As before, the data packet 318 ideally has a latency of two, which means that the node 202A should receive the data packet 318 at execution simulation time point 9. However, because the node 202A has its execution being simulated more slowly, it may actually receive the data packet 318 when it is at execution simulation time point 5. Therefore, the simulation can synchronize this substantially parallel execution of the nodes 202 by simply delaying receipt of the inter-node data packet 318 by the node 202A until the node 202A is at execution simulation time point 9.

Thus, FIG. 3B reflects the situation in which the node 202A is at a current execution simulation time point of 5 when the inter-node data packet 318 is supposed to arrive at the node 202A at an execution simulation time point of 9. Stated another way, in FIG. 3B the node 202A is at a current execution simulation time point (of 5) that is less than a target execution simulation time point (of 9) when the inter-node data packet 318 is supposed to arrive at the node 202A. This case is easily rectified by delaying transmission of the inter-node data packet 318 to the node 202A in simulation when the current execution simulation time point of the node 202A becomes equal to the target simulation time point, during the quantum 312.

It is noted that a slight modification of the situation of FIG. 3B can occur where the target execution simulation time point at which the inter-node data packet 318 is supposed to arrive at the node 202A in simulation is not during the current quantum 312. For instance, the quantum may have a quantum length of time of 10. If the target execution simulation time point at which the data packet 318 is supposed to arrive at the node 202A in simulation is 12, then this means that transmission of the data packet 318 to the node 202A in simulation is again delayed. However, unlike in the case described in the previous paragraph, transmission of the data packet 318 to the node 202A in simulation does not occur within the quantum 322, but rather occurs at an execution simulation time point of 2 within the next quantum. Such an execution simulation time point corresponds to a target execution simulation time point of 12, where the quantum length of the quantum 322 is 10, and adding 2 to this length yields 12.

Figure 3C:
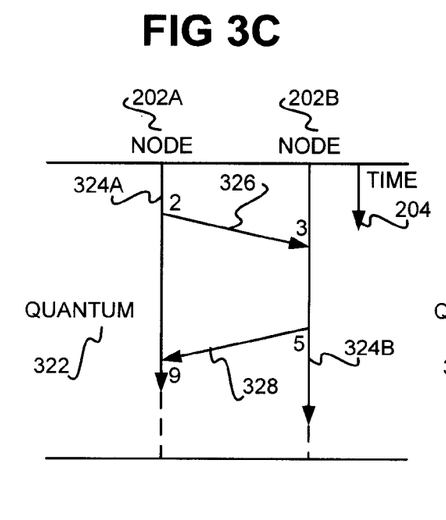

In FIG. 3C, simulation of execution of the node 202A within the quantum of simulation time 322 occurs slightly more quickly as compared to the simulation of execution of the node 202B within the quantum 322 does. This is indicated by the solid arrow 324A, corresponding to the execution simulation time of the node 202A within the quantum 322, being slightly shorter than the solid arrow 324E3, corresponding to the execution simulation time of the node 202B within the quantum 322. The arrows 324A and 324B can be collectively referred to as the arrows 324.

An inter-node data packet 326 is sent from the node 202A at execution simulation time point 2. Although the inter-node data packet 326 ideally has a latency of two, because the node 202B has its execution being simulated more slowly, the node 202B receives the data packet 326 earlier than expected, at execution simulation time point 3. It takes two units of execution time for the node 202B to process the data packet 326, and a responsive inter-node data packet 328 is sent back to the node 202A at execution simulation time point 5. As before, the data packet 328 ideally has a latency of two, which means that the node 202A should receive the data packet 328 at execution simulation time point 7. However, because the node 202A has its execution being simulated more quickly, it may actually receive the data packet 328 when it is at execution simulation time point 9.

The simulation cannot therefore synchronize this substantially parallel execution of the nodes 202, because the execution simulation time point 7 at which the node 202A should have received the inter-node data packet 328 has already passed, and it can be undesirable to "roll back" simulation of execution of the node 202A. Therefore, the data packet 328 is simply transmitted to the node 202A at execution simulation time point 9, where the simulation of execution of the node 202A has not yet finished for the quantum of simulation time 322. As such, the data packet 328 is considered a straggler data packet, in that it is transmitted to the node 202A after the data packet 328 was supposed to arrive at the node 202A. While transmitting the data packet 328 to the node 202A at a later point in time than it should have been can deleteriously affect execution simulation accuracy, embodiments of the present disclosure minimize the occurrence of straggler data packets, as is described in more detail later in the detailed description.

Thus, FIG. 3C reflects the situation in which the node 202A is at a current execution simulation time point of 9 when the inter-node data packet 328 is supposed to arrive at the node 202A at an execution simulation time point of 7. Stated another way, in FIG. 3C the node 202A is at a current execution simulation time point (of 9) that is greater than a target execution simulation time point (of 7) when the inter-node data packet 328 is supposed to arrive at the node 202A. However, simulation of execution of the node 202A is still occurring, such that the data packet 328 is still transmitted to the node 202A in simulation during the quantum of simulation time 322.

Figure 3D:
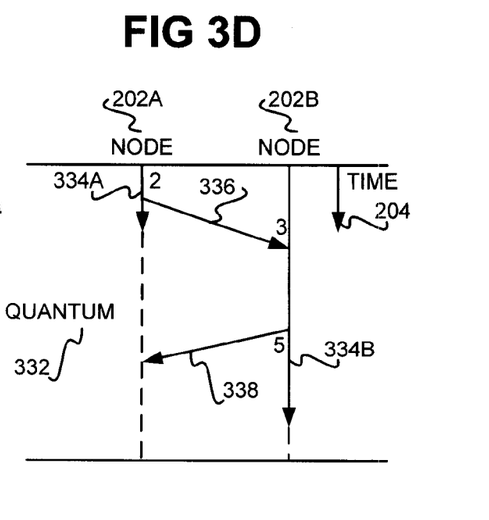

In FIG. 3D, simulation of execution of the node 202A within the quantum of simulation time 332 occurs significantly more quickly as compared to the simulation of execution of the node 202B within the quantum 332 does. This is indicated by the solid arrow 334A, corresponding to the execution simulation time of the node 202A within the quantum 332, being significantly shorter than the solid arrow 334B, corresponding to the execution simulation time of the node 202B within the quantum 332. The arrows 334A and 334B can be collectively referred to as the arrows 334.

An inter-node data packet 336 is sent from the node 202A at execution simulation time point 2. Although the inter-node data packet 336 ideally has a latency of two, because the node 202B has its execution being simulated more slowly, the node 202B receives the data packet 336 earlier than expected, at execution simulation time point 3. It takes two units of execution time for the node 202B to process the data packet 336, and a responsive inter-node data packet 338 is sent back to the node 202A at execution simulation time point 5. As before, the data packet 338 has a latency of two ideally, which means that the node 202A should receive the data packet 338 at execution simulation time point 7. However, because the node 202A has its execution being simulated much more quickly, in FIG. 3D its execution simulation has already been completed for the quantum 332 by the time the node 202B transmits the data packet 338.

The simulation cannot therefore synchronize this substantially parallel execution of the nodes 202, because in FIG. 3D, as in FIG. 3C, the execution simulation time point 7 at which the node 202A should have received the inter-node data packet 338 has already passed, and it can be undesirable to "roll back" simulation of execution of the node 202A. Furthermore, in FIG. 3D, but unlike as in FIG. 3C, the data packet 338 cannot simply be transmitted to the node 202A during the quantum of simulation time 332, because the simulation of execution of the node 202A has already been finished for the quantum 332.

Rather, the data packet 338 is scheduled for transmission to the node 202A at the beginning of the next quantum of simulation time immediately after the quantum 332. As such, in FIG. 3D, as in FIG. 3C, the data packet 338 is considered a straggler data packet, in that it is transmitted to the node 202A after the data packet 338 was supposed to arrive at the node 202A.

Thus, FIG. 3D reflects the situation in which the simulation of execution of the node 202A has already been completed, or has finished, for the current quantum of simulation time 332 when the inter-node data packet 328 is supposed to arrive at the node 202A at an execution simulation time point of 7. Stated another way, in FIG. 3D the node 202A has its execution simulation already finished, or completed, at the target execution simulation time point (of 7) when the inter-node data packet 338 is supposed to arrive at the node 202A. Although simulation of execution of the node 202A is not still occurring within the current quantum 332, the data packet 328 is still transmitted to the node 202A in simulation, but during the next quantum of simulation time after the current quantum 332.

A conservative approach to preventing straggler inter-node data packets from occurring is to set the quantum length of time of each quantum of simulation time to a value less than the latency of the inter-node data packets (i.e., less than the time it takes to transmit a data packet from one node to another node). Doing this guarantees that no inter-node data packet will be able to be transmitted in simulation from one node to another node within a given quantum, but rather ensures that transmission of any inter-node data packet will always occur over two quanta in simulation. As such, between the two quanta, the simulation of execution of the receiving node of the data packet can be synchronized so that it receives the data packet at the correct execution simulation time point.

Figure 4:
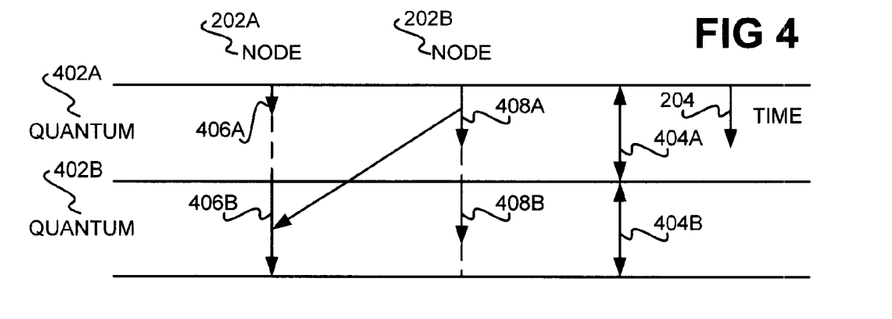
FIG. 4 is a diagram depicting how straggler inter-node data packets can be avoided when using a number of quanta of simulation time in simulating execution of a multiple-node computing system, according to an embodiment of the present disclosure.

FIG. 4 illustratively depicts this conservative approach to preventing straggler inter-node data packets from occurring, according to an embodiment of the present disclosure. As before, there are two nodes 202, where time proceeds downward as indicated by the arrow 204. There are two quanta of simulation time 402A and 402B, collectively referred to as the quanta 402, which have quantum lengths of time 404A and 404B, collectively referred to as quantum lengths 404. Over the two quanta 402, the node 202A has its execution simulated as indicated by the solid arrows 406A and 406B, collectively referred to as the arrows 406, and the node 202B has its execution simulated as indicated by the solid arrows 408A and 408B, collectively referred to as the arrows 408.

In FIG. 4, the quantum lengths 404 of the quanta 402 are equal to three time units, while the latency of an inter-node data packet 410 sent in simulation from the node 202B to the node 202A is four time units. This means that no matter when the node 202B sends the data packet 410 within the quantum 402A, the target simulation time point when the data packet 410 is to arrive at the node 202A is guaranteed never to be within the quantum 402A, but rather is guaranteed to be within the quantum 402B. For example, even if the node 202B sends the inter-node data packet 410 immediately when the quantum 402A starts, the quantum 402A will be over at the third time unit overall, but the data packet 410 will not be scheduled for delivery at the node 202A until the fourth time unit overall, within the quantum 402B.

Furthermore, the node 202A can have its simulation of execution synchronized between the quanta 402 so that the simulation of execution of the node 202A within the quantum 402B takes into account the execution simulation time point when the node 202A is to receive the inter-node data packet 410. For example, if the inter-node data packet 410 is sent from node 202B in simulation at the second time unit within the quantum 402A, this means that the data packet 410 will arrive in simulation at the node 202A at the second time unit within the quantum 402B (i.e., the fourth time unit overall). This is because the packet 410 has a latency of four time units and the quantum lengths 404 of the quanta 402 are both equal to three time units.

Between the quanta 402, the simulation of execution the node 202A is made aware that it will be receiving the data packet 410 at the second time unit within the quantum 402B. Therefore, when the simulation of execution of the node 202A has proceeded to the second time unit with the quantum 402B, if the execution simulation of the node 202A has not yet received the data packet 410, it can wait for the data packet 410 to arrive. As such, the synchronization of execution simulation of the nodes 202 that occurs between the quanta 402 can ensure that straggler inter-node data packets are prevented, by communicating to the nodes 202 which data packets they should expect to receive in simulation in the next quantum, and when.

The conservative approach for simulating substantially parallel execution of the nodes of a multiple-node computing system is thus useful in ensuring that straggler inter-node data packets are prevented. In the conservative approach, the quantum length of time of each quantum of simulation time is set to less than the smallest expected latency of any inter-node data packet that may be transmitted in simulation. However, as has been noted above, embodiments of the present disclosure dynamically modify the quantum lengths of the quanta. This is because statically setting the quantum length of each quantum at less than the smallest expected latency of any inter-node data packet unduly increases total execution simulation time.

Figure 5A:
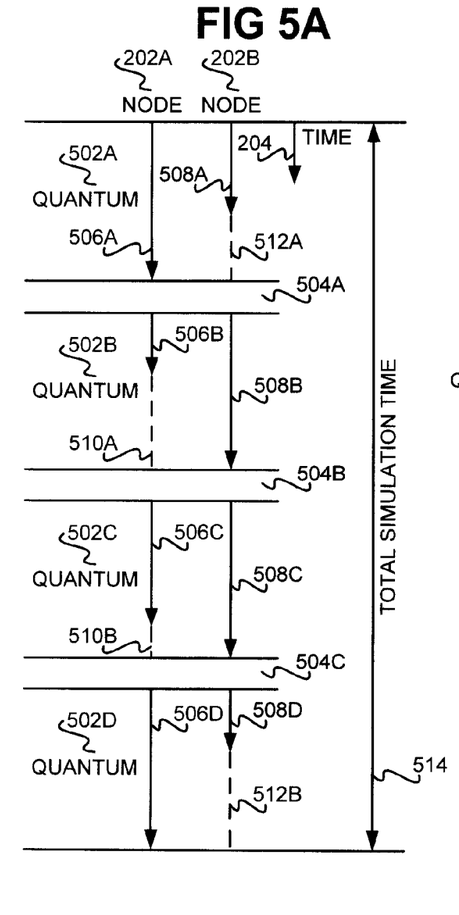
FIGS. 5A and 5B are diagrams depicting how using a number of quanta of simulation time having different quantum lengths can result in increasing or decreasing of simulation completion time when simulating execution of a multiple-node computing system, according to varying embodiments of the present disclosure.
Figure 5B:
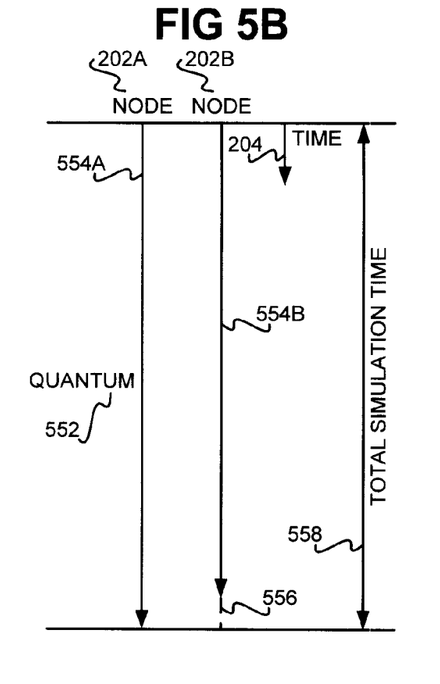

For instance, FIGS. 5A and 5B show the same simulation of execution of the two nodes 202, according to an embodiment of the present disclosure. In both FIGS. 5A and 5B, time again proceeds downward as indicated by the arrows 204. In FIG. 5A, there are four quanta of simulation time 502A, 502B, 502C, and 502D, collectively referred to as the quanta 502, whereas in FIG. 5B, there is one quantum of simulation time 552. FIGS. 5A and 5B are drawn to scale, meaning that the quantum length of time of each quantum 502 in FIG. 5A is much shorter than the quantum length of time of the quantum 552 in FIG. 5B.

In FIG. 5A, simulation of execution of the nodes 202 proceeds as follows. Over the quanta 502, the node 202A is simulated as indicated by arrows 506A, 506B, 506C, and 506D, collectively referred to as the arrows 506, and the node 202B is simulated as indicated by arrows 508A, 508B, 508C, and 508D, collectively referred to as the arrows 508. Dotted lines 510A and 510B, collectively referred to as the dotted lines 510, indicate when the simulation of execution of the node 202A has finished within the quanta 502 such that the simulation is waiting for the next quantum to occur. Likewise, dotted lines 512A and 512B, collectively referred to as the dotted lines 512, indicate when the simulation of the execution of the node 202B has finished within the quanta 502 such that the simulation is waiting for the next quantum to occur.

Furthermore, gaps 504A, 504B, and 504C, collectively referred to as the gaps 504, between successive quanta 502 correspond to the overhead (in time) needed to synchronize the nodes 202 before the next quantum begins. Such synchronization can include determining and informing the execution simulation of the nodes 202 the quantum length of the next quantum of simulation time, which node-executable instructions are to have their execution simulated in the next quantum, which inter-node data packets to expect at what simulation time points in the next quantum, and so on. The total execution simulation time 514 in FIG. 5A is thus the total of the quantum lengths of time of the quanta 502, plus the time delays represented by the gaps 504.

By comparison, in FIG. 5B, simulation of the nodes 202 proceeds as follows. Over the single quantum 552, the node 202A is simulated as indicated by the arrow 554A, while the node 202B is simulated as indicated by the arrow 554B, where the arrows 554A and 554B are collectively referred to as the arrows 554. The arrow 554A has a length equal to the total length of all the arrows 506 of FIG. 5A, whereas the arrow 554B has a length equal to the total length of all the arrows 508 of FIG. 5A. The arrow 554B is slightly shorter than the arrow 554A, meaning that there is a period of time in which the simulation of execution of the node 202B has finished within the quantum 552, as indicated by the dotted line 556.

The total simulation time 558 in FIG. 5B is thus simply equal to the length of the quantum 552. The total simulation time 558 in FIG. 5B is much shorter than the total simulation time 514 in FIG. 5A, because of two factors. First, there is no inter-quanta overhead within the single quantum 552 in FIG. 5B as compared to within the quanta 502 in FIG. 5A, where such overhead is represented by the gaps 504 in FIG. 5A. Second, in the quanta 502A in FIG. 5A, the nodes 202 have to at times wait for the next quantum to occur before execution simulation can continue (or end), as specifically represented by the dotted lines 510 and 512. This also contributes to the total simulation time 514 in FIG. 5A being longer than the total simulation time 558 in FIG. 5B.

Therefore, embodiments of the present disclosure attempt to balance two competing goals. First, straggler inter-node data packets are to be avoided, which militates in favor of shorter quantum lengths of time of the quanta of simulation time. Second, however, total simulation time should be as small as possible to ensure execution simulation performance, which militates in favor of longer quantum lengths of time of the quanta of simulation time. How one embodiment balances these two competing goals is now described in detail.

Figure 6A:
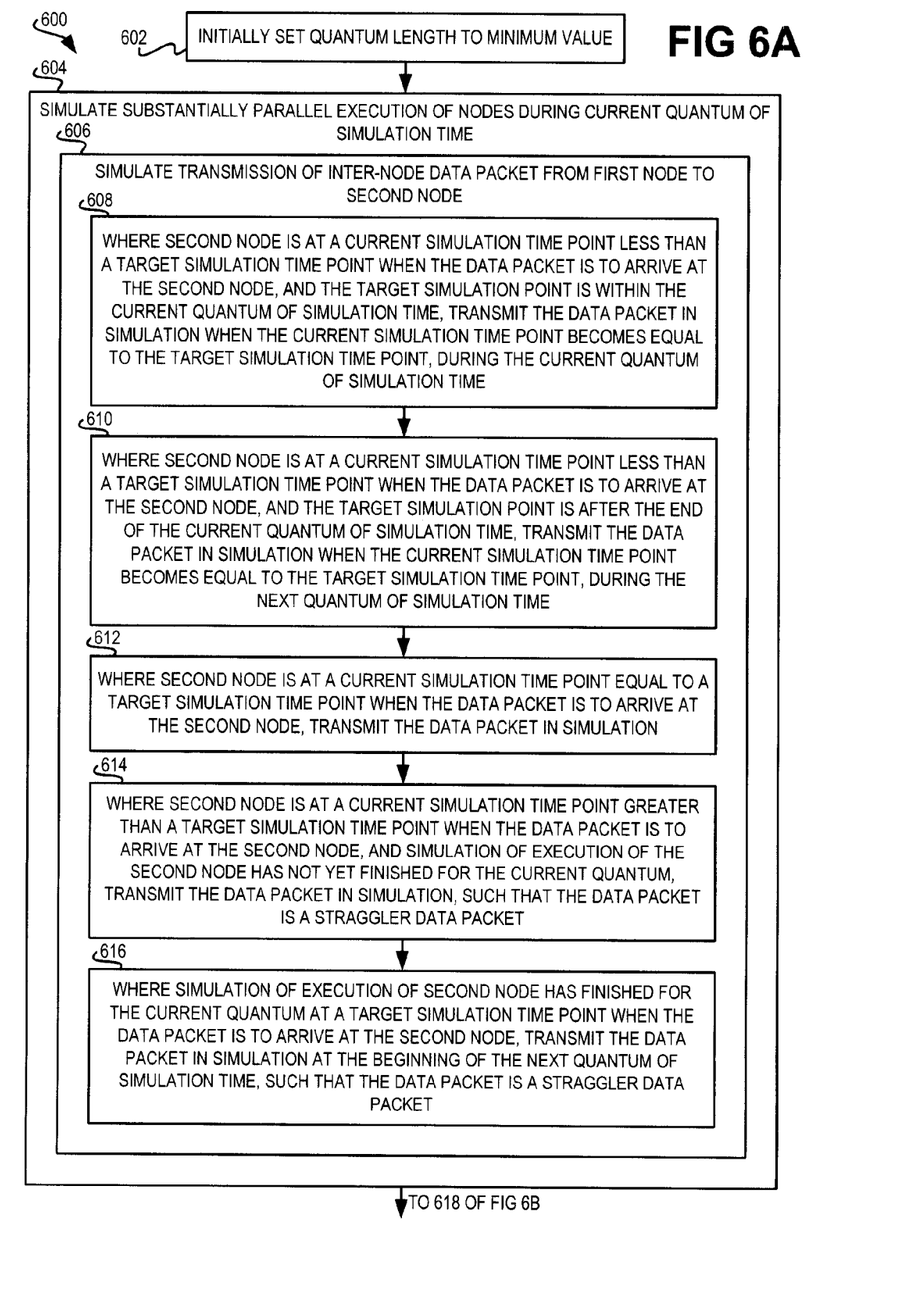
FIGS. 6A and 6B are flowcharts of a method for simulating substantially parallel execution of nodes of a multiple-node computing system using a number of quanta of simulation time in which quantum length is dynamically modified, according to an embodiment of the present disclosure.
Figure 6B:
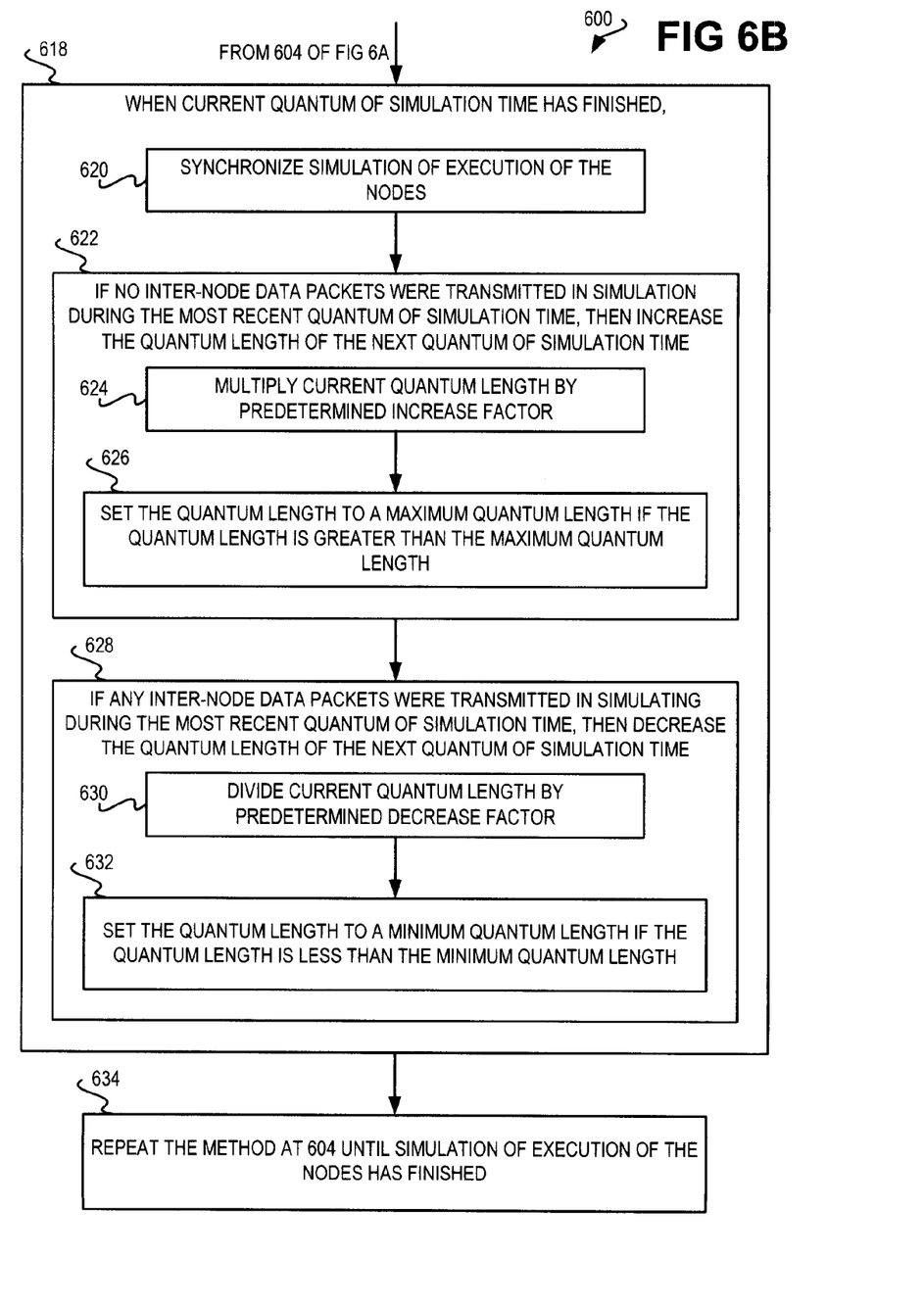

FIGS. 6A and 6B show a method 600 for simulating substantially parallel execution of nodes of a multiple-node computing system using a number of quanta of simulation time in which quantum lengths of time of the quanta are dynamically modified, according to an embodiment of the present disclosure. Referring first to FIG. 6A, the quantum length for the first quantum of simulation time is initially set to a minimum value (602). For instance, the minimum value may be the minimum latency time value of transmission of an inter-node data packet between two nodes, to ensure that at the beginning of the method 600, there are no straggler data packets. For the first iteration of the method 600, the first quantum is the current quantum of simulation time.

Substantially parallel execution of the nodes is simulated during (i.e., for) the current quantum of simulation time (604). As has been noted above, such execution simulation can include at times the simulation of the transmission of an inter-node data packet from a first node to a second node (606). In such instance, there are five different cases that can occur, as has been described above in relation to FIGS. 3A-3C.

First, the second node may be at a current simulation time point that is less than the target simulation time point when the data packet is to arrive at the second node, and the target simulation time point occurs within the current quantum of simulation time (608). In such instance, the data packet is transmitted in simulation to the second node (i.e., the data packet is to arrive at the second node in simulation) when the current simulation time point of the second node becomes equal to the target simulation time point, within the current quantum. This case has been described above in relation to FIG. 3B.

Similarly, second, the second node may be at a current simulation time point that is less than the target simulation time point when the data packet is to arrive at the second node, but the target simulation time point occurs after the current quantum of simulation time has ended (610). In such instance, the data packet is transmitted in simulation to the second node (i.e., the data packet is to arrive at the second node in simulation) when the current simulation time point of the second node becomes equal to the target simulation time point, as before, but within the next quantum. This case has also been described above in relation to FIG. 3B.

Third, the second node may be at a current simulation time point that is exactly equal to the target simulation time point when the data packet is to arrive at the second node (612). In such instance, the data packet is transmitted in simulation to the second node (i.e., the data packet arrives at the second node in simulation) without delay. This case has been described above in relation to FIG. 3A.

Fourth, the second node may be at a current simulation time point that is greater than the target simulation time point when the data packet is to arrive at the second node, and simulation of execution of the second node has not yet finished for the current quantum (614). In such instance, the data packet is transmitted in simulation to the second node (i.e., the data packet is to arrive at the second node in simulation) without delay, but the data packet is a straggler data packet. This case has been described above in relation to FIG. 3C.

Fifth, simulation of execution of the second node may have already finished for the current quantum at the target simulation time point when the data packet is to arrive at the second node (616). In such instance, the data packet is transmitted in simulation to the second node (i.e., the data packet is to arrive at the second node in simulation) at the beginning of the next quantum of simulation time, but the data packet here, too, is a straggler data packet. This case has been described above in relation to FIG. 3D.

Referring next to FIG. 6B, when the current quantum of simulation time has finished (618), simulation of execution of the nodes is synchronized for the next quantum of simulation time (620), if any. As has been noted above, such synchronization can include which node-executable instructions are to have their execution simulated in the next quantum, which inter-node data packets to expect at what simulation time points in the next quantum, and so on. Such synchronization can also include informing the execution simulation of the nodes the quantum length of the next quantum of simulation time, as is determined after parts 622 and 628 are performed, which are now described.

First, if no inter-node data packets were transmitted in simulation during the most recent (i.e., current) quantum of simulation time, then the quantum length of the next quantum of simulation time is increased as compared to the current quantum (622). In one embodiment, the quantum length increases slowly over successive such increases. Increasing the quantum length aids the performance of the simulation, since the smaller the quantum length is, the more quanta that will be needed to finish the simulation. That is, increasing the quantum length permits the simulation to be performed as quickly as posible.

At the same time, increasing the quantum length slowly helps reduce the likelihood that straggler inter-node data packets result during simulation. That is, if the quantum length is quickly increased, then the likelihood that a straggler inter-node data packet will result during such a relatively long quantum is increased. Therefore, in one embodiment of the present disclosure, the method 600 is conservative in increasing the quantum length when no inter-node data packet was transmitted in the most recent quantum of simulation time.

In one embodiment, the quantum length is increased as follows. The current quantum length (i.e., the quantum length of the current quantum) is multiplied by a predetermined increase factor (624). In one embodiment, this increase factor may be between 101% to 110%, which means that each time the quantum length is increased, it increases by one to ten percent. However, there is a predetermined maximum quantum length. Therefore, if the quantum length becomes greater than this maximum quantum length, it is set equal to the maximum quantum length (626).

Second, if one or more inter-node data packets were transmitted in simulation during the most recent (i.e., current) quantum of simulation time, then the quantum length of the next quantum of simulation time is decreased as compared to the current quantum (628). In one embodiment, the quantum length decreases quickly over successive such decreases. Decreasing the quantum length, especially quickly, reduces the likelihood that straggler inter-node data packets result during simulation. As soon as an inter-node data packet is transmitted, it is presumed, in other words, that other data packets are likely to follow in successive quanta, such that to avoid straggler data packets, the quantum length is quickly decreased.

In one embodiment, the quantum length is decreased as follows. The current quantum length (i.e., the quantum length of the current quantum) is divided by a predetermined decrease factor (630). In one embodiment, this decrease factor may be between a cube root and a square root of the maximum value for the quantum length. However, there is a predetermined minimum quantum length. Therefore, if the quantum length becomes less than this minimum quantum length, it is set equal to the minimum quantum length (632).

The method 600 is then repeated at part 604 of FIG. 6A for the next quantum of simulation time (i.e., where the next quantum becomes the new current quantum of simulation time), until simulation of execution of the nodes has finished (634). The method 600 thus dynamically modifies quantum length over successive quanta of simulation time, based on whether any inter-node data packets were transmitted in the immediately prior quantum. As inter-node data packets are transmitted over given quanta, the quantum length is quickly decreased, to substantially reduce the likelihood that straggler data packets will result. As given quanta occur in which no inter-node data packets are transmitted, the quantum length is slowly increased, to conservatively improve performance of the entire simulation while aiding the reduction in the likelihood that straggler data packets will result.

This embodiment of the present disclosure can be conceptualized by a speed bump metaphor. When a motor vehicle encounters a speed bump on the roadway, its driver quickly slows the vehicle down. Once the speed bump has passed, the driver slowly increases the speed of the vehicle, especially if the driver is uncertain as to whether there are more impending speed bumps. In the same way, when an inter-node data packet is encountered, the method 600 can quickly decrease the quantum length to prevent the likelihood that straggler data packets will occur. When no inter-node data packets are encountered, the method 600 can then increase the quantum length, to increase simulation performance, but slowly, because it may not be known whether there are more impending inter-node data packets that will be encountered.

This embodiment of the present disclosure can also be considered as leveraging how inter-node data packets may be transmitted in simulation of execution. In particular, typically when one inter-node data packet is transmitted, this event portends that subsequent inter-node data packets are likely to be transmitted soon. That is, such data packets may typically be transmitted in "bunches," interspersed by longer periods of time in which no data packets are transmitted. Therefore, when the first data packet is transmitted, it is advantageous to quickly decrease quantum length, since more data packets are likely to follow. Likewise, it is advantageous to slowly increase quantum length when no data packets are transmitted, because it may not be able to be known when another data packet will be transmitted in simulation, and in any case, performance will steadily increase due to the expected relatively long period of time in which no data packets are transmitted.

Figure 7:
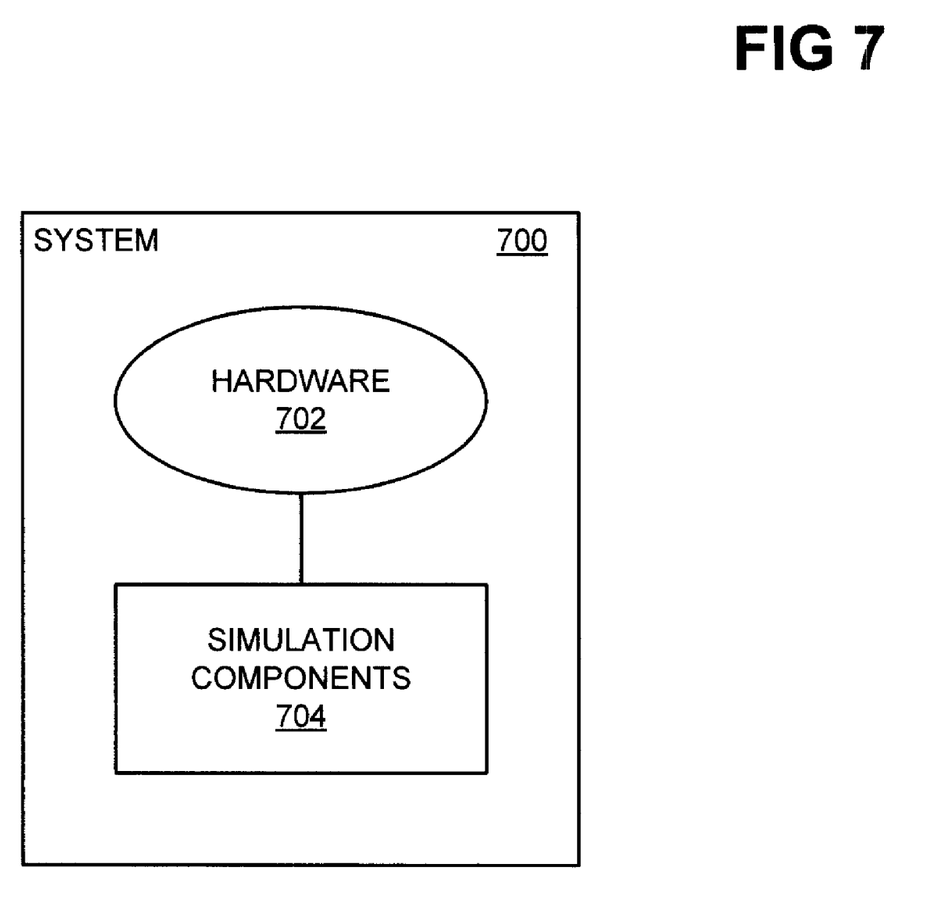
FIG. 7 is a diagram of a representative system for simulating substantially parallel execution of nodes of a multiple-node computing system, according to an embodiment of the present disclosure.

In conclusion, FIG. 7 shows a system 700, according to an embodiment of the present disclosure. The system 700 includes hardware 702 and one or more simulation components 704. The hardware 702 may include processors, memory, storage devices, network devices, and/or other types of hardware, as can be appreciated by those of ordinary skill within the art. The simulation component 704 is implemented within the hardware 702. For instance, the simulation component 704 may be software that is programmed to run on the hardware 702, such as a simulation computer program that runs on the hardware 702 via an operating system, as can be appreciated by those of ordinary skill within the art. As another example, the hardware 702 may include computer-readable media such as hard disk drives and semiconductor memory. In such instance, the hardware 702 can be considered as storing computer programs that are executable by processors to implement the simulation component 704.

The simulation component 704 performs the simulation that has been described in relation to the method 600 of FIGS. 6A and 6B. That is, the simulation component 704 can perform the method 600 that has been described. For instance, the simulation component 704 simulates substantially parallel execution of nodes over a number of quanta of simulation time that have a quantum length. Simulation of execution within each quantum can result in simulation of inter-node data packets being transmitted over a network interconnecting the nodes. Simulation of execution of the nodes is synchronized in-between successive quanta. Simulation of execution of each node within a given quantum can be performed by using a simulator like the simulator SimNow™, available from Advanced Micro Devices, Inc., of Sunnyvale, Calif.

Furthermore, the simulation component 704 dynamically modifies the quantum length in-between successive quanta such that the likelihood that a straggler inter-node data packet may result during simulation is reduced. This can be achieved by quickly decreasing the quantum length of the next quantum of simulation time when an inter-node data packet is encountered in the current quantum of simulation time, as has been described. At the same time, dynamic modification of the quantum length permits the simulation to be completed relatively quickly. This can be achieved by slowly increasing the quantum length of the next quantum of simulation time when an inter-node data packet is not encountered in the current quantum of simulation time, as has also been described.

We claim:

1. A method for simulating parallel execution of a plurality of nodes interconnected by a network, comprising:
   simulating substantially parallel execution of the nodes during a current quantum of simulation time having a quantum length;
   when the current quantum of simulation time has elapsed, synchronizing simulation of execution of the nodes;
   if no inter-node data packets were transmitted in simulation during the current quantum of simulation time, then increasing the quantum length;
   if one or more inter-node data packets were transmitted in simulation during the current quantum of simulation time, then decreasing the quantum length; and
   repeating the method until simulation of execution of the nodes has finished.

2. The method of claim 1, wherein simulating execution of each node in parallel during the current quantum of simulation time comprises:
   simulating transmission of an inter-node data packet from a first node of the plurality of nodes to a second node of the plurality of nodes.

3. The method of claim 2, wherein simulating execution of each node in parallel during the current quantum of simulation time further comprises:
   where the second node is at a current simulation time point less than a target simulation time point when the inter-node data packet is to arrive at the second node, and the target simulation time point is within the current quantum of simulation time,
   transmitting the inter-node data packet to the second node in simulation when the current simulation time point becomes equal to the target simulation time point, during the current quantum of simulation time.

4. The method of claim 2, wherein simulating execution of each node in parallel during the current quantum of simulation time further comprises:
   where the second node is at a current simulation time point less than a target simulation time point when the inter-node data packet is to arrive at the second node, and the target simulation time point is after an end of the current quantum of simulation time,
   transmitting the inter-node data packet to the second node in simulation when the current simulation time point becomes equal to the target simulation time point, during a next quantum of simulation time.

5. The method of claim 2, wherein simulating execution of each node in parallel during the current quantum of simulation time further comprises:
   where the second node is at a current simulation time point equal to a target simulation time point when the inter-node data packet is to arrive at the second node,
   transmitting the inter-node data packet to the second node in simulation.

6. The method of claim 2, wherein simulating execution of each node in parallel during the current quantum of simulation time further comprises:
   where the second node is at a current simulation time point greater than a target simulation time point when the inter-node data packet is to arrive at the second node, and the simulation of execution of the second node has not yet finished for the current quantum of simulation time, transmitting the inter-node data packet to the second node in simulation, such that the inter-node data packet is a straggler data packet in that the inter-node data packet is transmitted to the second node after the inter-node data packet was to arrive at the second node.

7. The method of claim 2, wherein simulating execution of each node in parallel during the current quantum of simulation time further comprises:
where the simulation of execution of the second node has finished for the current quantum of simulation time at a target simulation time point when the inter-node data packet is to arrive at the second node,
transmitting the inter-node data packet to the second node in simulation at a beginning of a next quantum of simulation time, such that the inter-node data packet is a straggler data packet in that the inter-node data packet is transmitted to the second node after the inter-node data packet was to arrive at the second node.

8. The method of claim 1, further comprising initially setting a quantum length to a value less than a minimum latency time value of transmission of an inter-node data packet.

9. The method of claim 1, wherein increasing the quantum length is such that the quantum length increases at a low rate over successive increases, and wherein decreasing the quantum length is such that the quantum length decreases at a high rate over successive decreases.

10. The method of claim 9,
wherein increasing the quantum length comprises:
multiplying the quantum length by a predetermined increase factor; and
setting the quantum length to a maximum quantum length where the quantum length is greater than the maximum quantum length after having been multiplied by the predetermined increase factor;
and wherein decreasing the quantum length comprises:
dividing the quantum length by a predetermined decrease factor; and
setting the quantum length to a minimum quantum length where the quantum length is less than the minimum quantum length after having been divided by the predetermined decrease factor.

11. The method of claim 10, wherein the predetermined increase factor is between 101% and 110%, and the predetermined decrease factor is between a cube root of a maximum value for the quantum length and a square root of the maximum value for the quantum length.

12. A system for simulating parallel execution of a plurality of nodes interconnected by a network, comprising:
hardware; and
one or more simulation components implemented within the hardware to:
simulate parallel execution of the nodes over a plurality of quanta of simulation time having a quantum length, and where simulation of execution of the nodes is synchronized in-between successive quanta; and
dynamically modify the quantum length in-between successive quanta such that a likelihood that a straggler inter-node data packet results during simulation is reduced while, where the straggler inter-node data packet is an inter-node data packet transmitted in simulation from a first node to a second node and that arrives at the second node later than when the straggler inter-node data packet was scheduled to arrive at the second node.

13. The system of claim 12, wherein the simulation components are to dynamically modify the quantum length in-between successive quanta by:
where no inter-node data packets were transmitted in simulation during a most recent quantum of simulation time, increasing the quantum length of a next quantum of simulation time such that the quantum length increases at a low rate over successive increases; and,
where one or more inter-node data packets were transmitted in simulation during the most recent quantum of simulation time, decreasing the quantum length of the next quantum of simulation time such that the quantum length decreases at high rate over successive decreases.

14. A non-transitory computer-readable medium having one or more computer programs stored thereon and executable by one or more processors to perform a method for dynamically modifying a quantum length of a plurality of quanta of simulation time in which parallel execution of a plurality of nodes interconnected by a network is simulated, and where simulation of execution of the nodes is synchronized in-between successive quanta, the method comprising, after each quantum of simulation time has elapsed:
where no inter-node data packets were transmitted in simulation during the quantum of simulation time, increasing the quantum length of a next quantum of simulation time such that the quantum length increases at low rate over successive increases; and
where one or more inter-node data packets were transmitted in simulation during the quantum of simulation time, decreasing the quantum length of the next quantum of simulation time such that the quantum length decreases at a high rate over successive decreases.

15. The non-transitory computer-readable medium of claim 14, wherein increasing at a high rate the quantum length over successive increases where no inter-node data packets were transmitted in simulation and decreasing at a high rate the quantum length over successive decreases where one or more inter-node data packets were transmitted reduces a likelihood that a straggler inter-node data packet results during simulation while permitting total simulation time to be small,
where the straggler inter-node data packet is an inter-node data packet transmitted in simulation from a first node to a second node and that arrives at the second node later than when the straggler inter-node data packet was scheduled to arrive at the second node.

* * * * *

UNITED STATES PATENT AND TRADEMARK OFFICE
CERTIFICATE OF CORRECTION

| | | |
|---|---|---|
| PATENT NO. | : 8,126,696 B1 | Page 1 of 1 |
| APPLICATION NO. | : 12/252121 | |
| DATED | : February 28, 2012 | |
| INVENTOR(S) | : Paolo Faraboschi et al. | |

It is certified that error appears in the above-identified patent and that said Letters Patent is hereby corrected as shown below:

In the Specifications:

In column 9, line 28, after "packets" delete "are" and insert -- be --, therefor.

In the Claims:

In column 14, line 11, in Claim 1, after "simulating" delete "substantially".

In column 16, line 6, in Claim 12, delete "while," and insert -- while permitting total simulation time to be small, --, therefor.

In column 16, line 24, in Claim 13, after "at" insert -- a --.

In column 16, line 37, in Claim 14, after "at" insert -- a --.

In column 16, line 45, in Claim 15, delete "high" and insert -- low --, therefor.

Signed and Sealed this
Eleventh Day of June, 2013

Teresa Stanek Rea
*Acting Director of the United States Patent and Trademark Office*